United States Patent
Urimoto et al.

(10) Patent No.: US 9,740,243 B2
(45) Date of Patent: Aug. 22, 2017

(54) HOUSING OF ELECTRONIC DEVICE AND ELECTRONIC DEVICE

(71) Applicant: Panasonic Intellectual Property Management Co., Ltd., Osaka (JP)

(72) Inventors: Tetsuya Urimoto, Osaka (JP); Akira Iwamoto, Osaka (JP); Kenichi Shindo, Osaka (JP); Takeshi Mori, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/190,955

(22) Filed: Jun. 23, 2016

(65) Prior Publication Data

US 2016/0306389 A1    Oct. 20, 2016

Related U.S. Application Data

(63) Continuation of application No. PCT/JP2014/004231, filed on Aug. 19, 2014.

(30) Foreign Application Priority Data

Dec. 25, 2013  (JP) ................................ 2013-267616

(51) Int. Cl.
*G06F 1/16*     (2006.01)
*H01M 2/10*     (2006.01)
(Continued)

(52) U.S. Cl.
CPC .......... *G06F 1/1635* (2013.01); *G06F 1/1656* (2013.01); *H01M 2/1066* (2013.01);
(Continued)

(58) Field of Classification Search
CPC .. H05K 5/0017; H05K 5/0086; H05K 5/0221; G06F 1/1635; G06F 1/1656; H01M 2/1066
See application file for complete search history.

(56) References Cited

U.S. PATENT DOCUMENTS 5,415,955 A * 5/1995 Kobayashi .......... H01M 2/1055
                                                    429/100
5,764,477 A * 6/1998 Ohgami ................ G06F 1/1616
                                                    292/163
(Continued)

FOREIGN PATENT DOCUMENTS

EP          0 944 122      9/1999
JP          10-64493       3/1998
(Continued)

OTHER PUBLICATIONS

English translation of the International Preliminary Report on Patentability and of the Written Opinion of the International Searching Authority mailed Jul. 7, 2016 in International (PCT) Application No. PCT/JP2014/004231.

(Continued)

*Primary Examiner* — Hoa C Nguyen
*Assistant Examiner* — Keith Depew
(74) *Attorney, Agent, or Firm* — Wenderoth, Lind & Ponack, L.L.P.

(57) ABSTRACT

A holder includes stoppers that restrict movement of an operation member in a predetermined direction by an amount exceeding a predetermined amount by abutting against a projection of the operation member when the operation member is moved in the predetermined direction. The operation member is made from an elastic body to be movable between the first position and the second position, in a case where the operation member is present at a position either the first position or the second position, when a force (Continued)

is applied to the operation protrusion in a direction perpendicular to the predetermined direction, the main body is bent in the perpendicular direction and the projection moves over the stopper.

3 Claims, 6 Drawing Sheets

(51) Int. Cl.
*H05K 5/00* (2006.01)
*H05K 5/02* (2006.01)

(52) U.S. Cl.
CPC ......... *H05K 5/0017* (2013.01); *H05K 5/0086* (2013.01); *H05K 5/0221* (2013.01)

(56) References Cited

U.S. PATENT DOCUMENTS

| | | | |
|---|---|---|---|
| 5,947,159 A | 9/1999 | Takahashi | |
| 6,051,334 A | 4/2000 | Tsurumaru et al. | |
| 6,660,427 B1 | 12/2003 | Hukill et al. | |
| 8,045,323 B2* | 10/2011 | Murakata | H05K 5/0086 361/679.01 |
| 8,107,227 B2* | 1/2012 | Long | H04M 1/0274 292/57 |
| 8,199,464 B2* | 6/2012 | Zuo | H01R 13/447 200/302.1 |
| 9,326,403 B2* | 4/2016 | Xie | H05K 5/0239 |
| 9,405,321 B2* | 8/2016 | Iwamoto | G06F 1/1633 |
| 9,603,272 B2* | 3/2017 | Yamaguchi | H05K 5/0239 |
| 2006/0019530 A1 | 1/2006 | Chun | |
| 2006/0176012 A1 | 8/2006 | Lee et al. | |
| 2008/0291641 A1* | 11/2008 | Sheng | G06F 1/1658 361/726 |
| 2010/0136397 A1 | 6/2010 | Lu | |
| 2010/0259879 A1* | 10/2010 | Watanabe | G06F 1/1658 361/679.08 |
| 2012/0120569 A1* | 5/2012 | Baek | H01M 2/1022 361/679.01 |
| 2013/0209866 A1* | 8/2013 | Watanabe | H01M 2/1066 429/163 |

FOREIGN PATENT DOCUMENTS

| | | |
|---|---|---|
| JP | 10-89545 | 4/1998 |
| JP | 10-334865 | 12/1998 |
| JP | 11-274751 | 10/1999 |
| JP | 2001-68082 | 3/2001 |
| JP | 2010-123486 | 6/2010 |
| JP | 2012-18771 | 1/2012 |

OTHER PUBLICATIONS

International Search Report issued Oct. 7, 2014 in International (PCT) Application No. PCT/JP2014/004231.

* cited by examiner

HOUSING OF ELECTRONIC DEVICE AND ELECTRONIC DEVICE

CROSS-REFERENCE TO RELATED APPLICATIONS

This is a continuation application of International Application No. PCT/JP2014/004231, with an international filing date of Aug. 19, 2014, which claims priorities of Japanese Patent Application No.: 2013-267616 filed on Dec. 25, 2013, the content of which is incorporated herein by references.

BACKGROUND

1. Technical Field

The present disclosure relates to a housing of an electronic device to which a battery is detachably mounted, and an electronic device including the housing.

2. Related Art

An electronic device is sometimes configured such that a battery for supplying electric power to the electronic device is detachable to a housing of the electronic device.

JP-A-11-274751 discloses a structure in which a battery is detachable to an outer covering member. According to this structure, the battery is locked to a housing by operating a locking button to slide the locking button in a predetermined direction, and the locking of the battery to the housing is released by operating the locking button to slide the locking button in a direction opposite to the predetermined direction.

SUMMARY

With the detachably mounting structure of the battery, described in JP-A-11-274751, the locking may be released even when a force in the direction opposite to the predetermined direction is unintentionally applied to the locking button.

The present disclosure provides a housing of an electronic device, capable of suppressing release of locking of a battery even when a force in a specific direction is applied to an operation member such as a locking button, and an electronic device including the housing.

The housing of an electronic device of the present disclosure is a housing to which a battery is detachably mounted. The housing of an electronic device includes an operation member, and a holder accommodating the operation member such that the operation member is movable in a predetermined direction between a first position and a second position. The operation member includes a main body having a plate-like shape, an operation protrusion formed at a middle position of the main body in its longitudinal direction, a projection formed at a middle position of the main body in its longitudinal direction, and protruded portions that are formed at both ends of the main body in its longitudinal direction and capable of engaging with recessed portions formed on a side portion of a battery; and is configured such that, when the operation member is present at the first position, the protruded portions of the operating member and recessed portions of the battery engage with each other and, when the operation member is present at the second position, the engagement between the protruded portions of the operating member and the recessed portions of the battery is released. The holder includes stoppers that restrict movement of the operation member in a predetermined direction by an amount exceeding a predetermined amount by abutting against the projection of the operation member when the operation member is moved in the predetermined direction. The operation member is made from an elastic body to be movable between the first position and the second position, in a case where the operation member is present at a position either the first position or the second position, when a force is applied to the operation protrusion in a direction perpendicular to the predetermined direction, the main body is bent in the perpendicular direction and the projection moves over the stopper.

The present disclosure also provides an electronic device including the housing.

According to the present disclosure, the operation member is formed using the elastic body and, in the case where the operation member is present at a position either the first position or the second position, when a force is applied to the operation protrusion in the direction perpendicular to the predetermined direction (the direction of its move), the main body is therefore bent in the perpendicular direction and the projection becomes movable between the first position and the second position in the predetermined direction over the stopper. That is, the operation member first becomes movable when a force is applied thereto in a direction different from the direction of its move. The operation member is therefore not moved by simply applying a force thereto in the moving direction, and the release of the locking is suppressed.

BRIEF DESCRIPTION OF DRAWINGS

FIGS. 7A to 7C are diagrams explaining a process where the battery pack is accommodated in the battery pack accommodating recessed portion when, for example, an operation member of the battery pack locking unit is present at a locking release position.

FIGS. 8A to 8D are diagrams explaining a process where the battery pack is accommodated in the battery pack accommodating recessed portion when, example, the operation member of the battery pack locking unit is present at a locking position.

DETAILED DESCRIPTION OF PREFERRED EMBODIMENT

First Embodiment

An embodiment will be described in detail with arbitrary reference to the drawings. No description however may be made that is more detailed than necessary. For example, no detailed description of already well known items and no repeated description for substantially same configurations may be made. This is to avoid unnecessary redundancy of the following description and is to facilitate the understanding by those skilled in the art.

The inventor(s) provide(s) the accompanying drawings and the following description for those skilled in the art to sufficiently understand the present disclosure, and do(es) not intend to limit the subject matter described in claims by the drawings and the description.

In the following description, terms each meaning a specific direction (for example, "above", "under", "left", "right", and other terms including any one of these) may be used while the use of those terms is to facilitate the understanding of the present disclosure with reference to the drawings, and the present disclosure should not be interpreted being limited by the meaning of each of those terms.

The embodiment of the present disclosure described below takes an example of application to a what-is-called tablet-type portable information terminal apparatus (hereinafter, arbitrarily, referred to as "tablet terminal apparatus" or simply as "apparatus"). The tablet terminal apparatus includes a CPU, a storing device such as a RAM, a ROM, or an SSD, an input unit, and various types of external interface, and realizes predetermined functions by arithmetic processing by the CPU based on programs stored in the storing apparatus.

1. Configuration 1-1. Configuration of Tablet Terminal Apparatus

Figure 1:
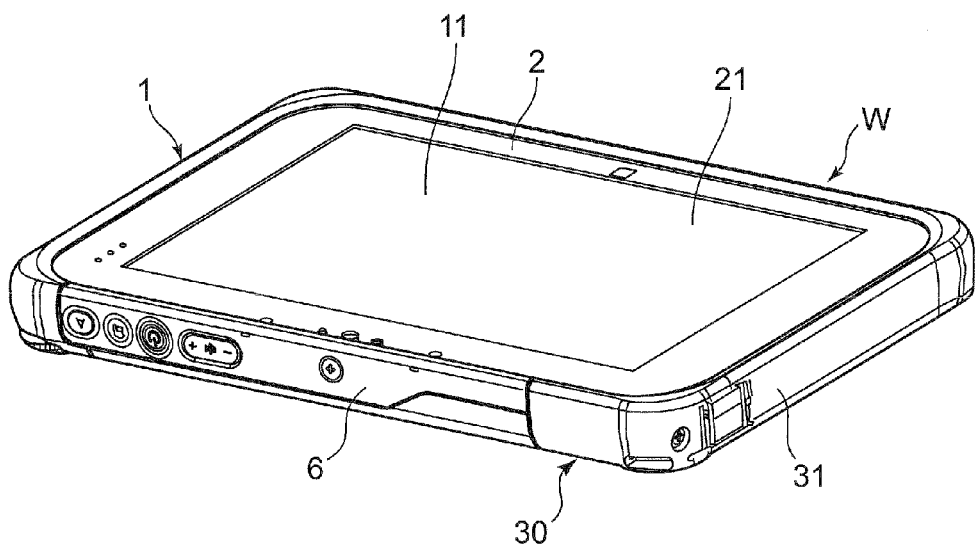
FIG. 1 is a perspective view of an upper face (a display face) of a tablet terminal apparatus according to an embodiment of the present disclosure.
Figure 2:
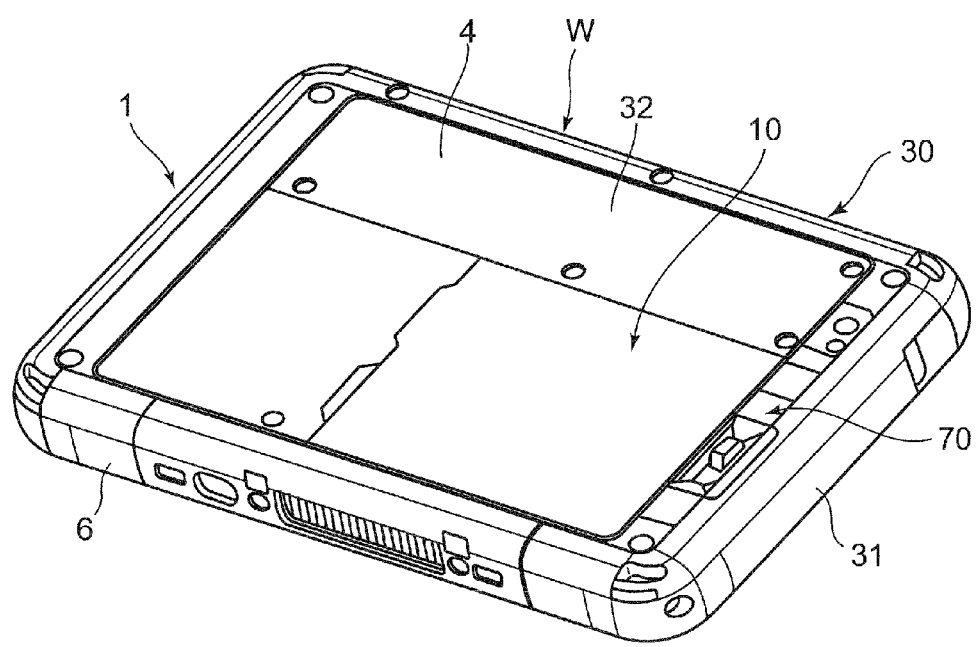
FIG. 2 is a perspective view of a lower face (a back face) of the tablet terminal apparatus according to the embodiment of the present disclosure.

FIG. 1 is a perspective view of an upper face (a display face) of the tablet terminal apparatus as the electronic device according to this embodiment. FIG. 2 is a perspective view of a lower face (a back face) of the tablet terminal apparatus.

As depicted in FIGS. 1 and 2, the tablet terminal apparatus W according to this embodiment is formed to have a substantially rectangular shape and has a predetermined thickness (height). A glass plate 21 is disposed on the upper face portion 2 of the tablet terminal apparatus W. A .display member 11 is disposed on the lower face of the glass plate 21. The .display member 11 is, for example, a liquid crystal displaying device. The .display member 11 may be a touch panel displaying apparatus for a user to be able to execute a touch-input. A battery pack 10 is mounted on the lower face portion 4 (the back side) of the tablet terminal apparatus W. The battery pack 10 is provided detachably according to a user operation on the battery lock operating member. Various operation switches and various connectors are disposed on a side face portion 6 of the tablet terminal apparatus W.

The tablet terminal apparatus W includes as a housing 1 an outer case 30 constituting an outer face thereof except the upper face unit constituted by the glass plate 21. The outer case 30 includes a side face member 31 constituting the side face portion 6 and a lower face member 32 constituting the lower face portion 4. The side face member 31 has a frame-like shape in a planar view thereof. The members constituting the outer case 30 are made from, for example, a resin such as elastomer and the like.

Figure 5:
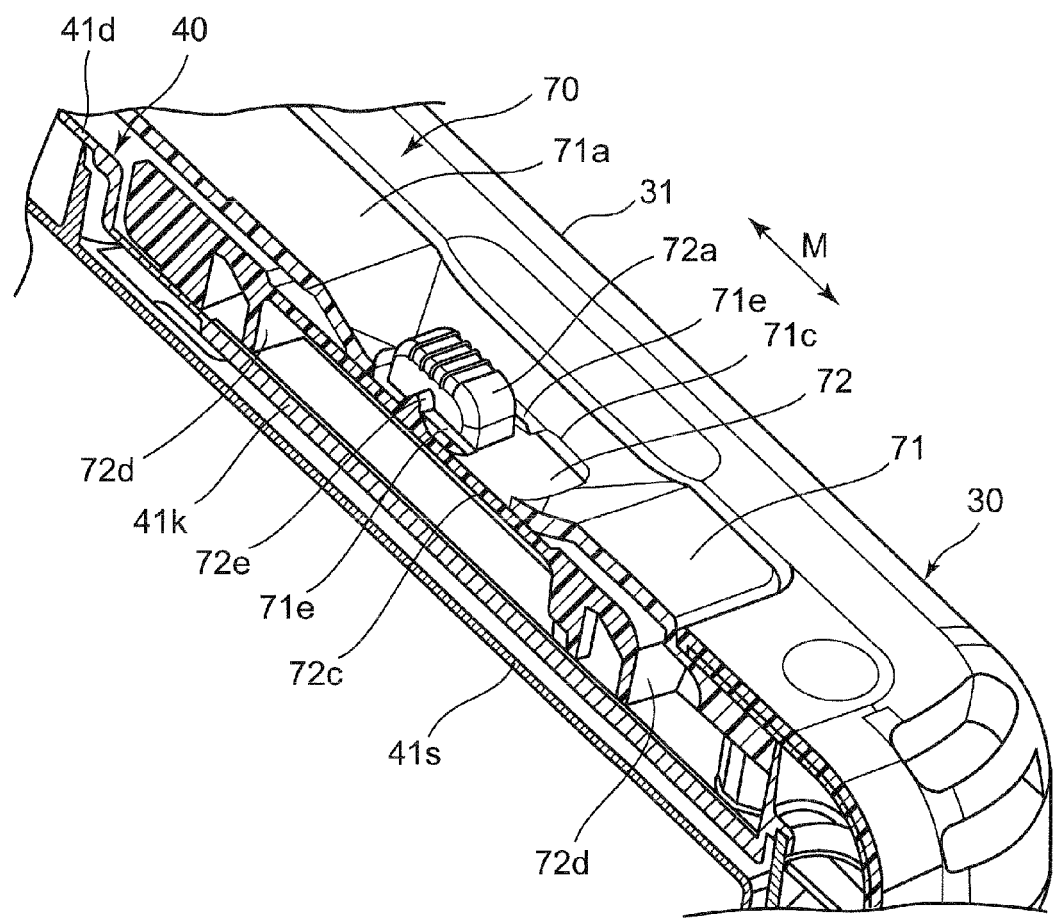
FIG. 5 is a cross-sectional view taken along an A-A line of FIG. 4.

An inner case 40 is accommodated in an inner space surrounded by the outer case 30 and the glass plate 21 (as shown in FIG. 5). The inner case 40 constitutes the frame (framework material) of the tablet terminal apparatus W, and is formed using a metal material such as, for example, magnesium (Mg) to secure the mechanical rigidity, and the like.

1-2. Locking Structure of Battery Pack

The tablet terminal apparatus W of this embodiment is configured such that the battery pack 10a is detachable. The configuration of a battery pack locking unit 70 that enables detachably mounting of the battery pack 10 will be described.

As depicted in FIG. 2, the battery pack 10 has a plate-like rectangular shape with a predetermined thickness and the battery pack locking unit 70 is disposed at a position adjacent to one side portion of the battery pack 10 (a side portion in the lower right of FIG. 2) accommodated in a lower face portion 4 of the tablet terminal apparatus W.

Figure 3:
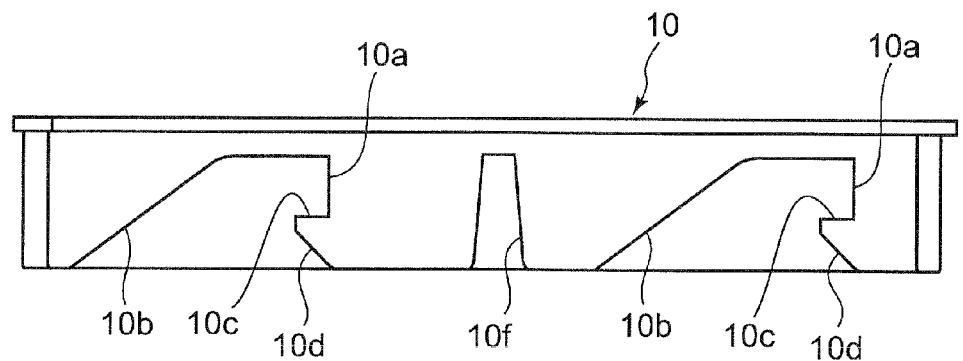
FIG. 3 is a diagram of a structure of a face of one side portion of a battery pack of the tablet terminal apparatus according to the embodiment of the present disclosure.

FIG. 3 is a diagram of the structure of a face of the one side portion of the battery pack 10 (hereinafter, referred to as "face to be locked"). On the face to be locked of the battery pack 10, a pair of engaging recessed portions 10a and a positioning recessed portion 10f are formed, the engaging recessed portions 10a being capable of engaging with engaging protruded portions 72b described later, of the battery pack locking unit 70, and the positioning recessed portion 10f being capable of engaging with a positioning protruded portion 41m of the housing 1.

Figure 4:
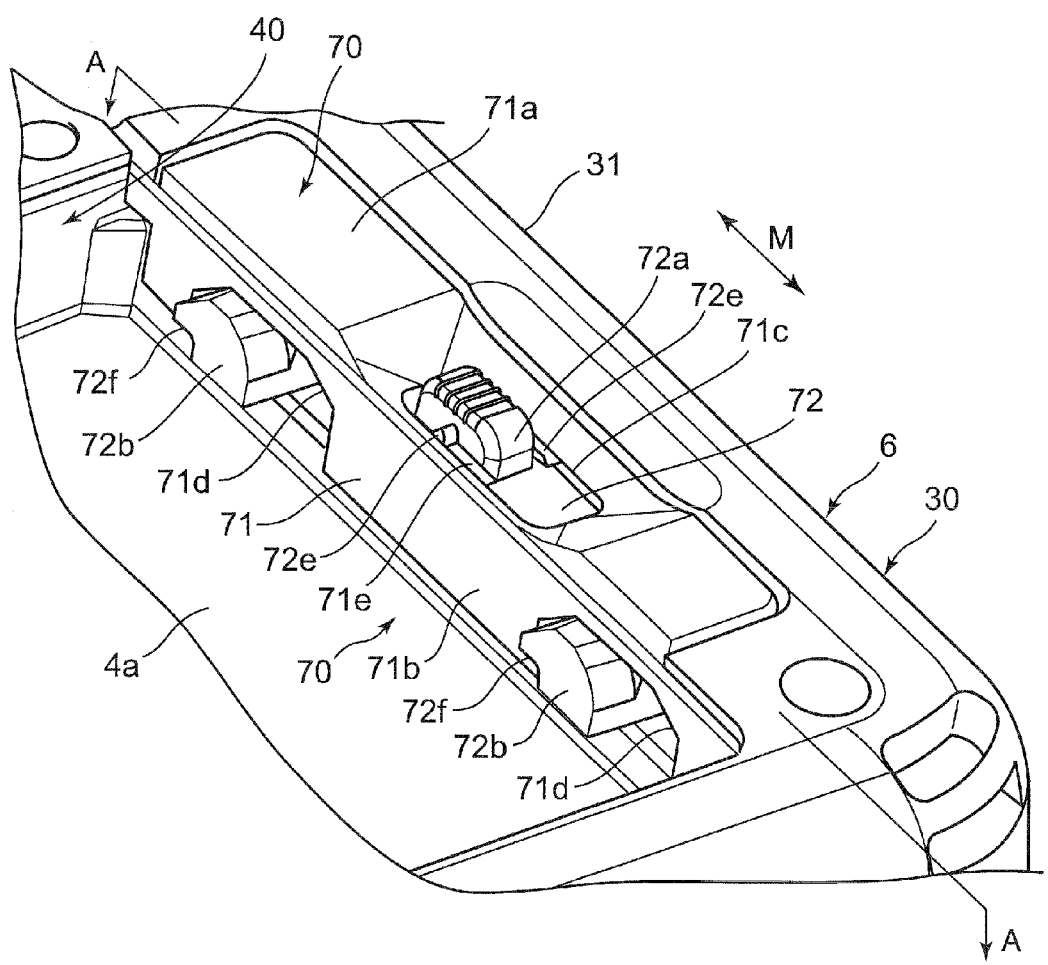
FIG. 4 is an enlarged perspective view of a structure in the vicinity of a battery pack locking unit of a lower face unit of the tablet terminal apparatus according to the embodiment of the present disclosure.

FIG. 4 is an enlarged perspective view of the structure in the vicinity of the battery pack locking unit 70 of the lower face portion 4 of the tablet terminal apparatus W. FIG. 4 depicts the state where the battery pack 10 is removed.

A battery pack accommodating recessed portion 4a to accommodate the battery pack 10 is disposed on the lower face portion 4 of the tablet terminal apparatus W. The battery pack accommodating recessed portion 4a includes a recessed portion formed on a lower wall portion 41d of an inner case 40. The battery pack accommodating recessed portion 4a is formed to have a shape and dimensions capable of accommodating the plate-like rectangular battery pack 10 without wobbling.

FIG. 5 is a cross-sectional view taken along an A-A line of FIG. 4. The battery pack locking unit 70 is accommodated in a locking unit accommodating recessed portion 41k disposed adjacent to the battery pack accommodating recessed portion 4a of the inner case 40. The locking unit accommodating recessed portion 41k includes a lower face portion 41s in parallel to the lower face of the tablet terminal apparatus W.

Figure 6A:
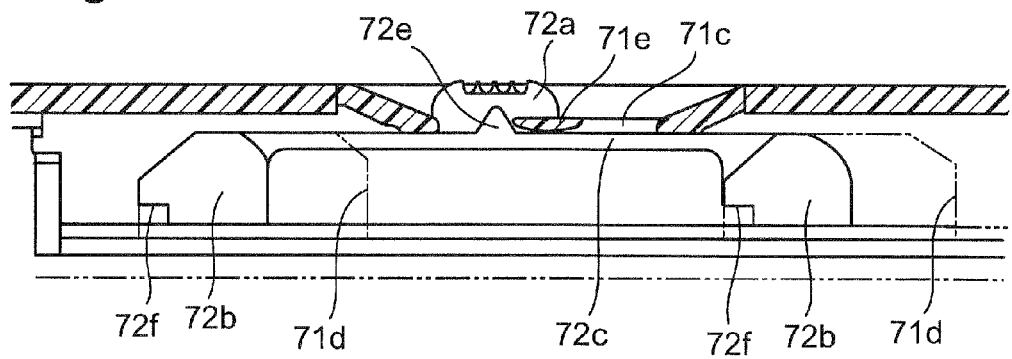
FIGS. 6A to 6C are diagrams of the battery pack locking unit of the tablet terminal apparatus according to the embodiment of the present disclosure depicted through a vertical face portion of a holder from a side of the battery pack accommodating recessed portion.
Figure 6B:
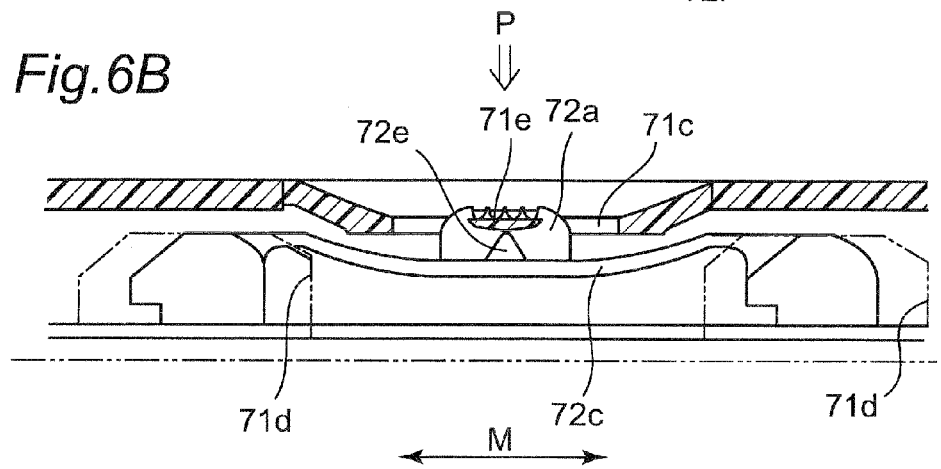

The battery pack locking unit 70 constitutes a portion of an outer covering member of the lower face of the tablet terminal apparatus W and, as depicted in FIGS. 4 and 5, includes a holder 71 fixed to the inner case 40 and an outer case 30, and an operation member 72 accommodated in the holder 71 and movable in the longitudinal direction of the holder 71 (a direction indicated by an arrow M in FIGS. 4 5, and 6B). In this embodiment, the longitudinal direction of the holder 71 is the longitudinal direction of the operation member 72 and is also a moving direction of the operation member 72. These directions will hereinafter be referred to arbitrarily as "predetermined direction M".

As depicted in FIGS. 4 and 5, the holder 71 includes a horizontal face portion 71a in substantially parallel to the lower face of the tablet terminal apparatus W and a vertical face portion 71b extending perpendicularly to the horizontal face portion 71a from an end of the horizontal face portion 71a. A substantially rectangular hole 71c is disposed at a position in the middle of the horizontal face portion 71a in its longitudinal direction. A pair of cut-away portions 71d is disposed on the ends of the vertical face portion 71b.

The operation member 72 includes a flat face portion 72c in parallel to the horizontal face portion 71a of the holder 71, an operation protruded portion 72a disposed at a position in the middle of the flat face portion 72c in its longitudinal direction and formed to protrude outward from the hole 71c of the holder 71, and support portions 72d disposed on both ends of the flat face portion 72c in its longitudinal direction. The operation protruded portion 72a is a part to be operated when a user executes an operation to attach or detach the battery pack 10. The engaging protruded portions 72b capable of engaging with the engaging recessed portions 10a of the battery pack 10 are disposed on the battery pack accommodating recessed portion 4a on the side of the support portions 72d. A triangular projection 72e (hereinafter, referred to as "triangle projection 72e") is disposed on the flat face portion 72c beside the operation protruded portion 72a.

As to the support portions 72d of the operation member 72, when the battery pack locking unit 70 is accommodated in the locking unit accommodating recessed portion 41k, a lower face portion 41s side end of the locking unit accommodating recessed portion 41k of the inner case 40 abuts against the lower face portion 41s.

The operation member 72 is formed using an elastic resin and is configured such that the flat face portion 72c is deformable. Concretely, when a force is applied to the operation protruded portion 72a in a direction to push the operation protruded portion 72a toward the inside of the tablet terminal apparatus W along the direction of the thickness of the apparatus W (an apparatus thickness direction), (A direction perpendicular to the longitudinal direction of the operation member 72. A direction indicated by an arrow P in FIG. 6B), the support portions 72d at the both ends of the flat face portion 72c abut against the lower face of the locking unit accommodating recessed portion 41k and, thereby, the operation member 72 is bent toward the inside of the apparatus in the apparatus thickness direction (the direction perpendicular to the longitudinal direction of the operation member 72) (see FIG. 6B).

The hole 71c of the holder 71 is formed such that the operation protruded portion 72a of the operation member 72 protrudes outward from the hole 71c and the operation protruded portion 72a is movable within a predetermined range in the longitudinal direction of the operation member 72. On the edge of the hole 71c, protrusion-like stoppers 71e are disposed that abut against the triangle projection 72e described later of the operation member 72 to limit (restrict) movement of the operation member 72 by an amount exceeding a predetermined amount. The cut-away portions 71d of the holder 71 are formed such that the engaging protruded portions 72b of the operation member 72 protrude from the cut-away portions 71d of the holder 71 toward the battery pack accommodating recessed portion 4a and the engaging protruded portions 72b are each movable within a predetermined range in the longitudinal direction of the operation member 72.

Figure 6C:
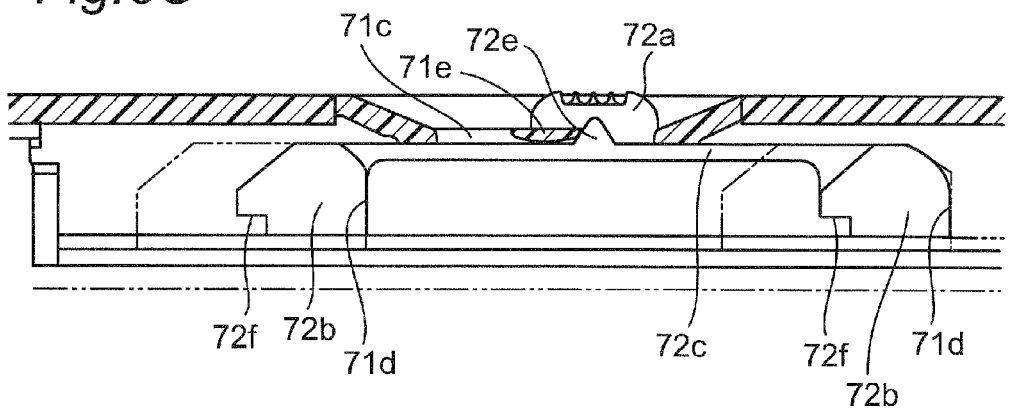

FIG. 6 is a diagram of the battery pack locking unit 70 depicted through the vertical face portion 71b of the holder 71 from a side of the battery pack accommodating recessed portion 4a. In FIG. 6A, the triangle projection 72e of the operation member 72 is positioned on one side of the stoppers 71e of the holder 71 in the longitudinal direction of the operation member 72. At this time, the engaging protruded portions 72b of the operation member 72 are each positioned on the one side of the cut-away portion 71d of the holder 71. This position is a position where the engaging protruded portion 72b of the operation member 72 engages with the engaging recessed portion 10a of the battery pack 10. That is, this position is a position where the battery pack 10 is locked being accommodated in the battery pack accommodating recessed portion 4a. FIG. 6B depicts the state where a force in a direction in parallel to the longitudinal direction of the operation member 72 is applied to the operation protruded portion 72a keeping the force applied thereto in a direction to push the operation protruded portion 72a toward the inside of the apparatus. At this time, while the operation member 72 moves in the longitudinal direction of the operation member 72, the flat face portion 72c of the operation member 72 is kept bent toward the inside of the apparatus; and the triangle projection 72e of the operation member 72 moves sinking toward the inside of the apparatus of the stopper 71e. In this state, when the force is applied to the operation protruded portion 72a in the direction in parallel to the longitudinal direction of the operation member 72, while the force is kept applied to the operation protruded portion 72a in the direction to push the operation protruded portion 72a toward the inside of the apparatus, the operation member 72 moves over the stopper 71e to the other side thereof and, as depicted in FIG. 6C, the triangle projection 72e of the operation member 72 is positioned at the other side of the stopper 71e. This position is a position where the engagement between the engaging protruded portions 72b of the operation member 72 and the engaging recessed portions 10a of the battery pack 10 is released. This position is a position where the battery pack 10 is not locked while being accommodated in the battery pack accommodating recessed portion 4a and a user can take out the battery pack 10.

In contrast, when taking out the battery pack 10 in the state depicted in FIG. 6C, that is, the state where the battery pack 10 is locked in the battery pack accommodating recessed portion 4a, the user moves the operation protruded portion 72a (the operation member 72) toward a locking release position (to the right in FIG. 6), keeping applying the force to the operation protruded portion 72a in the direction to push the operation protruded portion 72a toward the inside of the apparatus (the direction perpendicular to the direction of the move of the operation protruded portion 72a) and. Thereby, the locking release state can be established depicted in FIG. 6A through the state depicted in FIG. 6B.

The structure of the engaging recessed portions 10a of the battery pack 10 will be described in more detail with reference to FIG. 3 described above. Each of the engaging recessed portions 10a each include a first guiding portion 10b that, when the battery pack 10 is accommodated in the battery pack accommodating recessed portion 4a, abuts against the engaging protruded portion 72b of the operation member 72 and guides the operation member 72 to the side of a locking position. The first guiding portion 10b has a straight line slope inclined by a predetermined angle relative to an insertion direction of the battery pack 10 (a direction perpendicular to the lower face (the upper face) of the tablet terminal apparatus W). The engaging recessed portion 10a has a second guiding portion 10d that, when the battery pack 10 is accommodated in the battery pack accommodating recessed portion 4a, abuts against the engaging protruded portion 72b of the operation member 72 and guides the operation member 72 toward the locking release position. The engaging recessed portion 10a also has a locking face 10c capable of engaging with a cut-away locking face 72f (see FIG. 4) disposed on a corner of the engaging protruded portion 72b of the operation member 72. The second guiding portion 10d includes a straight line slope inclined by a predetermined angle toward the side opposite to that of the case for the first guiding portion 10b.

Figure 7A:
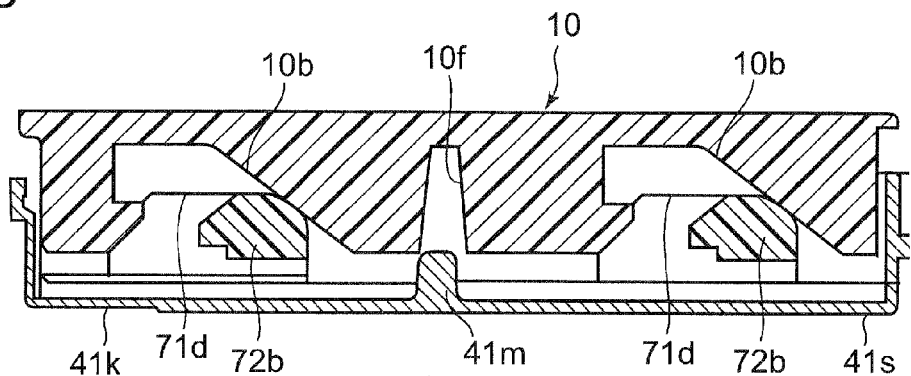
FIGS. 7A to 7C are diagrams explaining a process where the battery pack is accommodated in the battery pack accommodating recessed portion of the tablet terminal apparatus according to the embodiment of the present disclosure. Concretely.
Figure 7B:
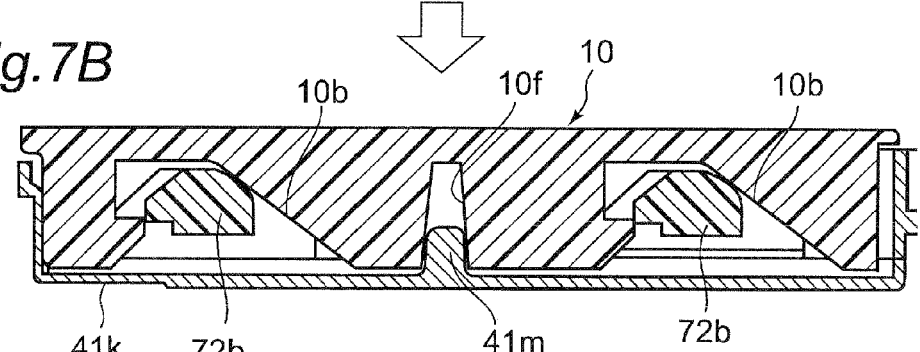
Figure 7C:
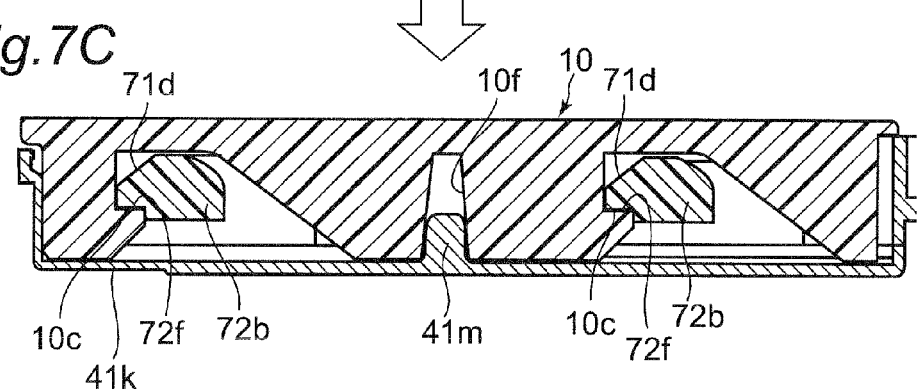

FIGS. 7A to 7C and FIGS. 8A to 8D are diagrams for explaining a process when the battery pack 10 is accommodated in the battery pack accommodating recessed portion 4a. For example, FIGS. 7A to 7C are diagrams explaining a process when the battery pack 10 is accommodated in the battery pack accommodating recessed portion 4a when the operation member 72 of the battery pack locking unit 70 is present at the locking release position. FIGS. 8A to 8D are diagrams explaining a process when the battery pack 10 to be accommodated in the battery pack accommodating recessed portion 4a when the operation member 72 of the battery pack locking unit 70 is present at the locking position.

As depicted in FIG. 7A, in the case where the operation member 72 of the battery pack locking unit 70 is present at the locking release position, when accommodation of the battery pack 10 into the battery pack accommodating recessed portion 4a is started, the engaging protruded portions 72b of the operation member 72 abut against the first guiding portions 10b of the battery pack 10. From this state, when the battery pack 10 is further moved toward the battery pack accommodating recessed portion 4a as depicted in FIG. 7B, the engaging protruded portions 72b are guided by the first guiding portions 10b, and then the operation member 72 moves toward the locking position (to the left in FIGS. 7A to 7C). When the battery pack 10 is accommodated in the battery pack accommodating recessed portion 4a as depicted in FIG. 7C, the operation member 72 moves to the locking position and the locking faces 72f of the engaging protruded portions 72b of the operation member 72 and the locking faces 10c of the engaging recessed portions 10a of the battery pack 10 abut against each other, and then movement of the battery pack 10 relative to the battery pack accommodating recessed portion 4a in a direction opposite to the direction for the accommodation is restricted. That is, the battery pack 10 cannot be taken out. When the battery pack 10 is accommodated in the battery pack accommodating recessed portion 4a, the positioning recessed portion 10f of the battery pack 10 and the positioning protruded portion 41m of the inner case 40 are fitted with each other and, thereby, positioning of the battery pack 10 relative to the battery pack accommodating recessed portion 4a is executed.

Figure 8A:
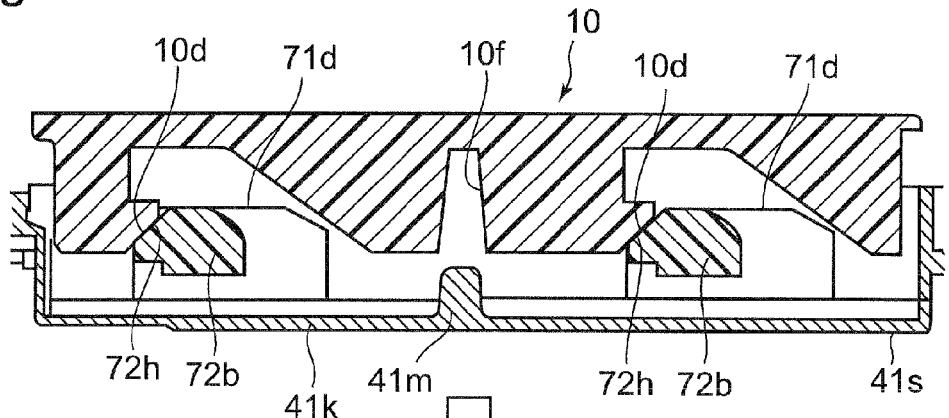
FIGS. 8A to 8D are diagrams explaining a process where the battery pack is accommodated in the battery pack accommodating recessed portion of the tablet terminal apparatus according to the embodiment of the present disclosure. Concretely.
Figure 8B:
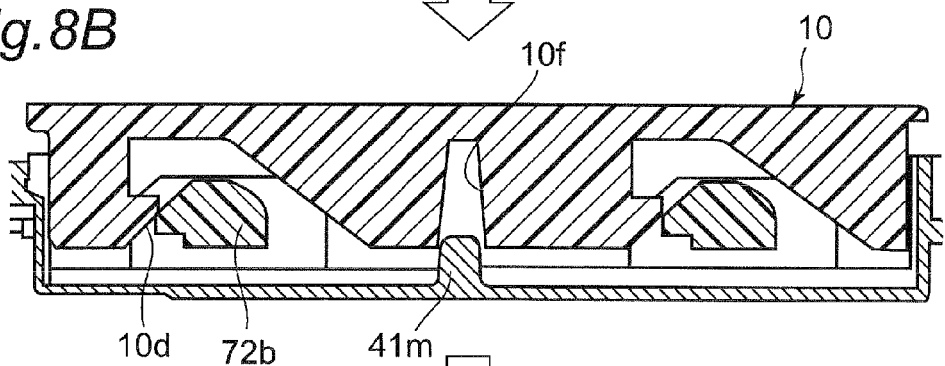
Figure 8C:
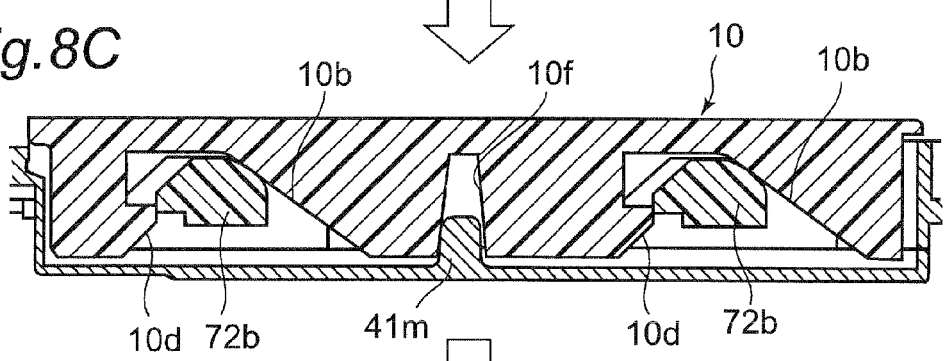
Figure 8D:
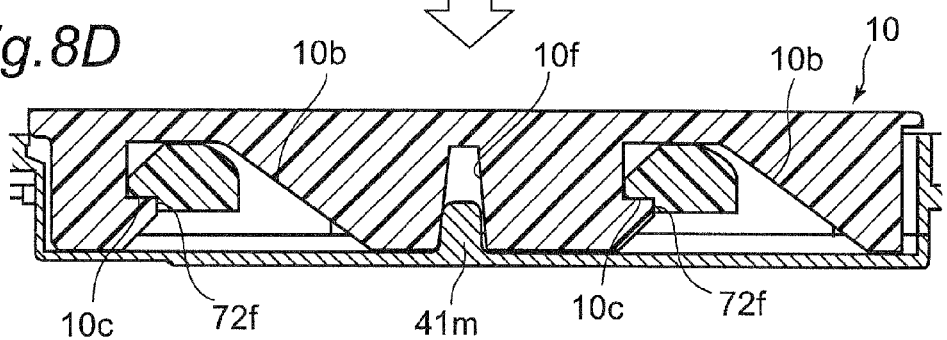

As depicted in FIG. 8A, in the case where the operation member 72 of the battery pack locking unit 70 is present at the locking position, when the accommodation of the battery pack 10 into the battery pack accommodating recessed portion 4a is started, the engaging protruded portions 72b of the operation member 72 abut against the second guiding portions 10d of the battery pack 10. From this state, when further moving the battery pack 10 toward the battery pack accommodating recessed portion 4a as depicted in FIG. 8B, the engaging protruded portions 72b are guided by the second guiding portions 10d, and then the operation member 72 moves toward the locking releasing position (to the right in FIGS. 8A to 8D). When the battery pack 10 is further moved toward the battery pack accommodating recessed portion 4a as depicted in FIG. 8C, the second guiding portions 10d is not present any more and the engaging protruded portions 72b abut against the first guiding portions 10b. Thus, when the battery pack 10 is caused to further approach the inside of the battery pack accommodating recessed portion 4a, thereafter, the engaging protruded portions 72b are therefore guided by the first guiding portions 10b and the operation member 72 moves toward the locking position (to the left in FIGS. 8A to 8D). As depicted in FIG. 8D, when the battery pack 10 is accommodated in the battery pack accommodating recessed portion 4a, the operation member 72 moves to the locking position, and the locking faces 72f of the engaging protruded portions 72b of the operation member 72 and the locking faces 10c of the engaging recessed portions 10a of the battery pack 10 engage with each other, and then movement of the battery pack 10 in the direction opposite to the direction for the accommodation is restricted. That is, the battery pack 10 cannot be taken out.

In this manner, in this embodiment, the battery pack 10 can be accommodated in the battery pack accommodating recessed portion 4a not only when the accommodation is attempted of the battery pack 10 in the battery pack accommodating recessed portion 4a in the case where the operation member 72 of the battery pack locking unit 70 is present at the locking release position, but also when the accommodation is attempted of the battery pack 10 in the battery pack accommodating recessed portion 4a in the case where the operation member 72 of the battery pack locking unit 70 is present at the locking position due to, for example, a mistake of the user.

2. Conclusion

The housing 1 of the tablet terminal apparatus W of the present disclosure is configured such that a battery is detachably mounted. The housing 1 of the tablet terminal apparatus W includes the operation member 72, and the holder 71 accommodating the operation member 72 such that the operation member 72 is movable in the predetermined direction M between the locking position (the first position) and the locking release position (the second position). The operation member 72 includes the flat portion 72c (the main body) having a plate-like shape, the operation protruded portion 72a formed at a middle position of the flat face portion 72c in its longitudinal direction, the triangle projection 72e (the projection) formed at a middle position of the flat face portion 72c in its longitudinal direction, and engaging protruded portions 72b (the protruded portions) formed at both ends of the flat face portion 72c in its longitudinal direction and capable of engaging with the engaging recessed portions 10a (the recessed portions) formed on the side portion of the battery pack 10 (the battery). The operation member 72 is configured such that, when the operation member 72 is present at the locking position, the engaging protruded portions 72b of the operating member 72 and the engaging recessed portions 10a of the battery pack 10 engage with each other and, when the operation member 72 is present at the locking release position, the engagement between the engaging protruded portions 72b of the operation member 72 and the engaging recessed portions 10a of the battery pack 10 is released. The holder 71 includes the stoppers 71e that restrict movement of the operation member 72 in the predetermined direction M by an amount exceeding the predetermined amount by abutting against the triangle projection 72e of the operation member 72 when the operation member 72 is moved in the predetermined direction M. The operation member 72 is made from an elastic body such that, in a case where the operation member 72 is present at a position either the locking position or the locking release position, when a force is applied to the operation protruded portion 72a in the direction perpendicular to the predetermined direction M, the flat face portion 72c is bent in the apparatus thickness direction (the perpendicular direction) and the triangle projection 72e becomes movable between the locking position and the locking release position over the stopper 71e.

According to the housing 1 of the tablet terminal apparatus W of the present disclosure, because the operation member 72 is formed using the elastic body, in the case where the operation member 72 is present at the position either the locking position or the locking release position, when a force is applied to the operation protruded portion 72a in the direction perpendicular to the predetermined direction M (the direction of the move), the flat face portion 72c is bent in the apparatus thickness direction (the perpendicular direction) and the triangle projection 72e becomes movable in the predetermined direction M between the locking position and the locking release position over the stopper 71e. That is, the operation member 72 becomes first movable when the force is applied thereto in a direction different from the direction of its move. The operation member 72 is therefore not moved by simply applying a force thereto in the moving direction, and the release of the locking is suppressed.

In this embodiment, the second guiding portions 10d (the guiding portions) are disposed on the engaging recessed portions 10a of the battery pack 10, the second guiding portions 10d abutting against the engaging protruded portions 72b to cause the operation member 72 to move toward the locking release position when the battery pack 10 is fitted in the battery pack accommodating recessed portion 4a in the state where the operation member 72 is present at the locking position.

With this configuration, the battery pack 10 can be accommodated in the battery pack accommodating recessed portion 4a even when the accommodation of the battery pack 10 into the battery pack accommodating recessed portion 4a is attempted in the case where the operation member 72 of the battery pack locking unit 70 is present at the locking position due to, for example, a mistake of the user.

Other Embodiments

As above, the first embodiment has been described as an example of the technique disclosed in this application. The technique in the present disclosure is however not limited to this and is applicable to an embodiment to which a change, replacement, addition, omission, etc., are arbitrarily made.

In this embodiment, the case is described where the electronic device is the tablet terminal apparatus. The electronic device is however not limited to this. The present disclosure is applicable widely to electronic devices such as a notebook computer, an electronic notebook, and an electronic gaming machine.

As above, the embodiments have been described as examples of the technique in the present disclosure. To do this, the accompanying drawings and the detailed description have been provided.

The components depicted in the accompanying drawings and described in the detailed description may therefore include not only the components essential for solving the problem but also the components not essential for solving the problem to exemplify the technique. It should not therefore be readily recognized that those non-essential components are essential based on the fact that those non-essential components are depicted in the accompanying drawings and described in the detailed description.

The embodiments are to exemplify the technique in the present disclosure and various changes, replacements, additions, omissions, etc., can therefore be made to the embodiments within the scope of claims or a scope equivalent thereto.

INDUSTRIAL APPLICABILITY

The present disclosure is applicable widely to portable electronic devices such as a notebook computer, a tablet computer, an electronic notebook, and an electronic gaming machine.

The invention claimed is:

1. A housing of an electronic device to which a battery is detachably mounted, comprising:
an operation member; and
a holder that accommodates the operation member such that the operation member is movable in a predetermined direction between a first position and a second position, wherein
the operation member comprises:
a main body having a plate-like shape;
an operation protrusion that is formed at a middle position of the main body in a longitudinal direction thereof;
a projection that is formed at a middle position of the main body in the longitudinal direction thereof; and
protruded portions that are formed at both ends of the main body in the longitudinal direction thereof, the protruded portions being capable of engaging with recessed portions formed on a side portion of the battery, wherein
the operation member is configured such that, when the operation member is present at the first position, the protruded portions of the operation member and the recessed portions of the battery engage with each other and, when the operation member is present at the second position, the engagement between the protruded portions of the operation member and the recessed portions of the battery is released, wherein
the holder comprises stoppers that restrict movement of the operation member in the predetermined direction by an amount exceeding a predetermined amount by abutting against the projection of the operation member when the operation member is moved in the predetermined direction, wherein
the operation member is made from an elastic body to be movable between the first position and the second position, in a case where the operation member is present at a position either the first position or the second position, when a force is applied to the operation protrusion in a direction perpendicular to the predetermined direction, the main body is bent in the perpendicular direction and the projection moves over the stopper.

2. An electronic device comprising the housing of an electronic device of claim 1.

3. The electronic device of claim 2, wherein
a guiding portion is disposed on the recessed portions of the battery, the guiding portion abutting against the protruded portion to cause the operation member to move to the second position when the battery is accommodated in an accommodating space in the state where the operation member is present at the first position.

* * * * *